United States Patent
Joeng et al.

(10) Patent No.: US 12,246,408 B2
(45) Date of Patent: Mar. 11, 2025

(54) POLISHING PAD AND METHOD OF FABRICATING SEMICONDUCTOR DEVICE USING THE SAME

(71) Applicant: SK enpulse Co., Ltd., Gyeonggi-do (KR)

(72) Inventors: Eun Sun Joeng, Gyeonggi-do (KR); Jong Wook Yun, Seoul (KR); Jang Won Seo, Seoul (KR)

(73) Assignee: SK ENPULSE CO., LTD., Gyeonggi-do (KR)

( * ) Notice: Subject to any disclaimer, the term of this patent is extended or adjusted under 35 U.S.C. 154(b) by 199 days.

(21) Appl. No.: 17/470,214

(22) Filed: Sep. 9, 2021

(65) Prior Publication Data
US 2022/0072678 A1   Mar. 10, 2022

(30) Foreign Application Priority Data
Sep. 10, 2020 (KR) .................. 10-2020-0115799

(51) Int. Cl.
*B24B 37/00* (2012.01)
*B24B 37/005* (2012.01)
(Continued)

(52) U.S. Cl.
CPC .......... *B24B 37/013* (2013.01); *B24B 37/005* (2013.01); *B24B 37/205* (2013.01);
(Continued)

(58) Field of Classification Search
CPC ....... B24B 7/228; B24B 37/205; B24B 37/20; B24B 37/24; B24B 37/30; B24D 3/22; B24D 18/0009; B24D 18/0045
See application file for complete search history.

(56) References Cited

U.S. PATENT DOCUMENTS 5,851,842 A * 12/1998 Katsumata ........ H01J 37/32935
216/85
6,336,841 B1 * 1/2002 Chang ................... B24B 37/013
451/6
(Continued)

FOREIGN PATENT DOCUMENTS

| CN | 104942701 A | * 9/2015 | ........... B24B 37/013 |
| KR | 10-2014-0144291 A | 12/2014 | |
| KR | 10-1945874 B1 | 2/2019 | |

OTHER PUBLICATIONS

Absorbance to Transmittance Converter (Beer Lambert Calculator); wherein the Beer Lambert Law is provided as a mathematical relationship/function, i.e. independent of a prior art date and used as evidence. (Year: NA).*

(Continued)

*Primary Examiner* — Makena S Markman
(74) *Attorney, Agent, or Firm* — IP & T GROUP LLP

(57) ABSTRACT

The present disclosure relates to an endpoint detection window of a polishing pad for use in a polishing process. The polishing pad may prevent an error in detection of the endpoint of the polishing process by preventing a difference in endpoint detection performance from occurring due to a difference in the wavelength of a laser between polishing apparatuses. The present disclosure may also provide a method of fabricating a semiconductor device using the polishing pad.

15 Claims, 2 Drawing Sheets

(51) Int. Cl.
*B24B 37/013* (2012.01)
*B24B 37/20* (2012.01)
*B24B 37/22* (2012.01)
*B24B 37/24* (2012.01)
*B24B 37/26* (2012.01)
*B24B 49/12* (2006.01)
*H01L 21/02* (2006.01)
*H01L 21/66* (2006.01)

(52) U.S. Cl.
CPC .............. *B24B 37/22* (2013.01); *B24B 37/24* (2013.01); *B24B 37/26* (2013.01); *B24B 49/12* (2013.01); *H01L 21/02013* (2013.01); *H01L 22/26* (2013.01)

(56) References Cited

U.S. PATENT DOCUMENTS

| | | | | |
|---|---|---|---|---|
| 6,984,163 | B2* | 1/2006 | Roberts | B24B 37/205 |
| | | | | 451/6 |
| 2005/0113008 | A1 | 5/2005 | Roberts | |
| 2006/0037699 | A1 | 2/2006 | Nakamori et al. | |
| 2009/0137189 | A1* | 5/2009 | Fukuda | B24B 37/205 |
| | | | | 451/6 |
| 2013/0273813 | A1* | 10/2013 | Prasad | B24B 37/24 |
| | | | | 451/526 |
| 2015/0273651 | A1 | 10/2015 | Qian et al. | |
| 2015/0306730 | A1* | 10/2015 | Qian | B24B 37/205 |
| | | | | 438/692 |
| 2015/0375361 | A1* | 12/2015 | Qian | B24B 53/017 |
| | | | | 216/53 |
| 2015/0375362 | A1* | 12/2015 | Qian | B24B 37/24 |
| | | | | 216/22 |
| 2019/0047112 | A1* | 2/2019 | Fu | B24B 37/245 |

OTHER PUBLICATIONS

Written Opinion for the Singaporean Application No. 10202109923S issued by the Intellectual Property Office of Singapore on Oct. 4, 2022.

Extended European Search Report issued by the European Patent Office on Feb. 10, 2022.

Office Action issued by the Korean Intellectual Property Office on Jan. 17, 2022.

Office Action for the Taiwanese Patent Application No. 110133753 issued by the Taiwanese Patent Office on Nov. 9, 2022.

* cited by examiner

[FIG. 1]
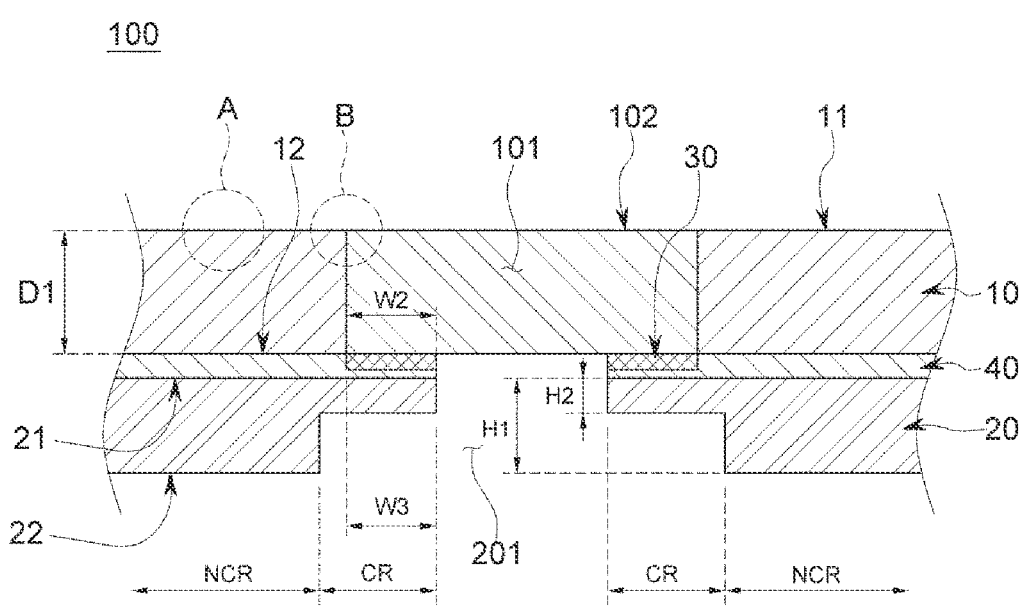

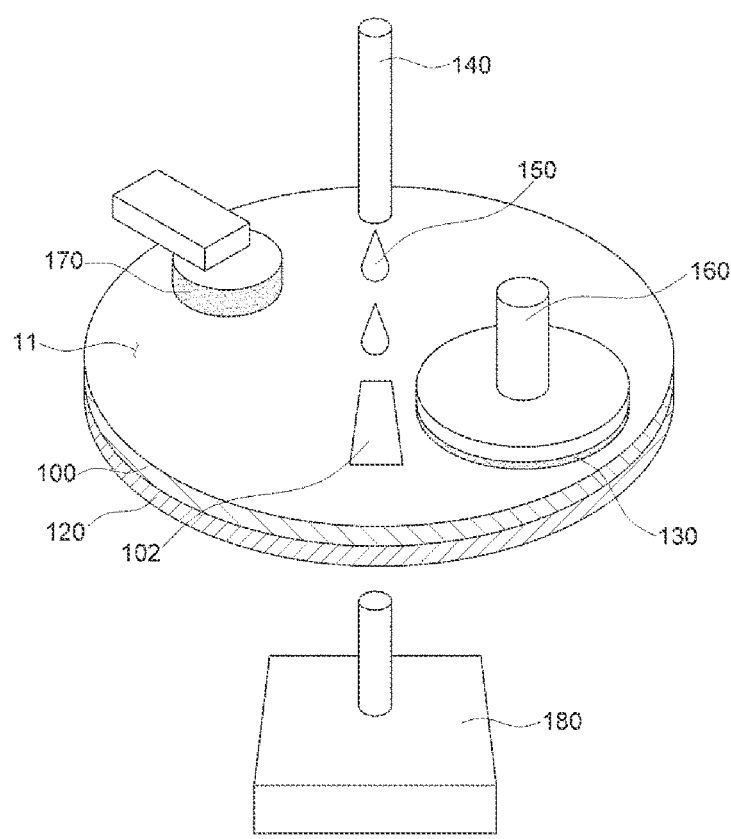
[FIG. 2]

POLISHING PAD AND METHOD OF FABRICATING SEMICONDUCTOR DEVICE USING THE SAME

CROSS-REFERENCE TO RELATED APPLICATION(S)

This application claims priority to Korean Patent Application No. 10-2020-0115799, filed on Sep. 10, 2020, the disclosure of which is incorporated herein by reference in its entirety.

BACKGROUND OF THE INVENTION

Field of the Invention

The present disclosure relates to a polishing pad for use in a chemical mechanical planarization (CMP) process and a method of fabricating a semiconductor device using the same.

Description of the Related Art

Among semiconductor fabrication processes, a chemical mechanical planarization (CMP) process is a process that mechanically planarizes an uneven surface of a wafer by allowing a platen and a head to rotate relative to each other while subjecting the wafer surface to a chemical reaction by the supply of a slurry, in a state in which the wafer is attached to the head and brought into contact with the surface of a polishing pad formed on the platen.

The chemical mechanical planarization process is performed using a polishing pad, and may be used in various ways in semiconductor fabrication processes, as well as for flattening processing of optical materials such as memory disks, magnetic disks, optical lenses or reflective mirrors, glass plates, or materials such as metals, which require a high degree of surface flatness.

With the miniaturization of semiconductor circuits, the importance of the CMP process has been further highlighted. A polishing pad is an essential subsidiary material in the CMP process among semiconductor fabrication processes and plays an important role in realizing CMP performance.

In recent years, various methods have been proposed to detect the endpoint of the CMP process by measuring the thickness of a wafer.

For example, as a method for in situ determination of the flatness of the wafer surface, a method has been proposed which includes bonding a window to a polishing pad and measuring the thickness of a wafer through a reflected beam generated by a laser interferometer through the window. In the in-situ method, an error in end-point detection may be minimized only when the difference in light transmittance between before and after polishing is small while the window maintains the incident light intensity at a constant level.

However, in the in-situ method, a difference in the performance for detecting the endpoint of the polishing process may occur due to a difference in the wavelength of the laser passing through the window of the polishing pad. It is necessary to develop a polishing pad capable of preventing this problem.

SUMMARY OF THE INVENTION

An object of the present disclosure is to provide a polishing pad and a method of fabricating a semiconductor device using the same.

Another object of the present disclosure is to provide a polishing pad capable of preventing an error in endpoint detection by preventing a difference in polishing process endpoint detection performance from occurring due to a difference in the wavelength of a laser between polishing apparatus.

Still another object of the present disclosure is to provide a polishing pad capable of having high versatility that satisfies a sensing range regardless of a change in wavelength of measurement light, because the end-point detection window of the polishing pad satisfies an absorbance change uniformity (ACU) within a specific range, and thus shows a constant absorbance change within a specific wavelength range and a low variation in absorbance.

Yet another object of the present disclosure is to provide a method of fabricating a semiconductor device using the polishing pad capable of preventing the occurrence of a difference in endpoint detection performance deviation.

To achieve the above objects, a polishing pad according to one embodiment of the present disclosure may include a polishing layer and an endpoint detection window, wherein the window may have an absorbance change uniformity (ACU) of 1.5 to 2.5 as calculated by the following Equation 1:

$$ACU = \frac{Ax + Ay}{Az} \qquad \text{[Equation 1]}$$

wherein:
Ax is the absorbance of the window, measured with light having a wavelength of x;
Ay is the absorbance of the window, measured with light having a wavelength of y; and
Az is the absorbance of the window, measured with light having a wavelength of z, wherein
x is 550 nm, y is 750 nm, and z is 650 nm.

A method for fabricating a semiconductor device according to another embodiment of the present disclosure includes steps of: 1) providing a polishing pad including a polishing layer and an endpoint detection window; 2) performing a polishing process on a semiconductor substrate while allowing the semiconductor substrate and the polishing layer to rotate relative to each other so that the polishing-target surface of the semiconductor substrate is in contact with the polishing surface of the polishing layer; and 3) measuring the thickness of the semiconductor substrate through the endpoint detection window of the polishing pad and detecting the endpoint of the polishing process, wherein the window may have an absorbance change uniformity (ACU) of 1.5 to 2.5 as calculated by the following Equation 1:

$$ACU = \frac{Ax + Ay}{Az} \qquad \text{[Equation 1]}$$

wherein:
Ax is the absorbance of the window, measured with light having a wavelength of x;
Ay is the absorbance of the window, measured with light having a wavelength of Y;
Az is the absorbance of the window, measured with light having a wavelength of z: wherein
x is 550 nm, y is 750 nm, and z is 650 nm.

BRIEF DESCRIPTION OF THE DRAWINGS

FIG. 1 is a sectional view of a polishing pad according to one embodiment of the present disclosure.

FIG. 2 is a schematic process view showing a process for fabricating a semiconductor device according to one embodiment of the present disclosure.

DESCRIPTION OF SPECIFIC EMBODIMENTS

Hereinafter, embodiments of the present disclosure will be described in detail so that those skilled in the art can easily carry out the present invention. However, the present invention may be embodied in a variety of different forms and is not limited to the embodiments described herein.

All numbers expressing quantities of components, properties such as molecular weights and reaction conditions, and so forth used in the present disclosure are to be understood as being modified in all instances by the term "about".

Unless otherwise stated herein, all percentages, parts, ratios, etc. are by weight.

In the present disclosure, it is understood that when any part is referred to "including" or "containing" any component, it may further include other components, rather than excluding other components, unless otherwise stated.

As used herein, "a plurality" refers to more than one.

A polishing pad according to one embodiment of the present disclosure may include a polishing layer and an endpoint detection window, wherein the window may have an absorbance change uniformity (ACU) of 1.5 to 2.5 as calculated by the following Equation 1:

$$ACU = \frac{Ax + Ay}{Az} \quad \text{[Equation 1]}$$

wherein:

Ax is the absorbance of the window, measured with light having a wavelength of x;

Ay is the absorbance of the window, with light having a wavelength of y; and

Az is the absorbance of the window, measured with light having a wavelength of z.

When x is 550 nm, y is 750 nm, and z is 650 nm, the absorbance change uniformity may be about 1.5 to about 2.5.

In general, a polishing pad is used to chemically polish the polishing-target surface of a semiconductor wafer using a polishing slurry while mechanically rubbing the semiconductor substrate. The polishing-target layer of the semiconductor substrate, which is polished by the mechanical and chemical action of the polishing pad and the slurry, should be polished until it has a predetermined thickness. That is, it is necessary to detect a polishing endpoint at which polishing should be stopped, and to this end, the endpoint is detected by detecting the thickness of the polishing-target layer using light.

A polishing end-point detection apparatus for a conventional chemical mechanical polishing system specifically includes: a disk-shaped platen top plate having a through-hole in the periphery thereof; an optical sensor unit inserted into the through-hole of the platen top plate; and a polishing pad positioned on the platen top plate to provide a polishing surface, which is intended to come into contact with the polishing-target layer of a semiconductor substrate, and including an endpoint detection window corresponding to the optical sensor unit.

The optical sensor unit may be configured to emit light from a light emitting unit provided at a position separate from the top plate, and to transmit light, reflected from the polishing-target layer of the semiconductor substrate, to a light receiving unit provided at a separate position.

The light emitted from the optical sensor unit may have different wavelengths depending on the type of polishing system, and when the light passes through the window of the polishing pad, a difference in endpoint detection performance may occur due to the wavelength of the light.

Accordingly, the polishing pad of the present disclosure includes an endpoint detection window, and the endpoint detection window may prevent endpoint detection performance from occurring due to a difference in light wavelength between polishing apparatuses.

Hereinafter, the polishing pad of the present disclosure will be described in detail with reference to FIG. 1.

FIG. 1 schematically shows a sectional view of a polishing pad 100 according to one embodiment. Specifically, FIG. 1 schematically shows a sectional view of a portion in which a window 102 is formed in the polishing pad 100. Referring to FIG. 1, the polishing pad 100 includes a polishing layer 10, and the polishing layer 10 includes a first surface 11, which is a polishing surface, and a second surface 12 opposite thereto. In addition, the polishing layer 10 includes a first through-hole 101 penetrating from the first surface 11 to the second surface 12, and the window 102 is disposed in the first through-hole 101.

In addition, the polishing pad 100 further includes a support layer 20 facing the second surface 12 of the polishing layer 10. The support layer 20 includes a third surface 21 facing the polishing layer 10 and a fourth surface 22 opposite thereto, and includes a second through-hole 201 connected with the first through-hole 101 while penetrating from the third surface 21 to the fourth surface 22. As the second through-hole 201 is formed to be connected to the first through-hole 101, the polishing pad 100 includes a light pass that penetrates the entire thickness from the top surface to the bottom surface, and the method of optically detecting the endpoint through the window 102 may be effectively applied.

In the polishing pad 100, the second through-hole 201 may be smaller than the first through-hole 101, and the bottom surface of the window 102 may be supported by the third surface 21. As the second through-hole 201 is formed to be smaller than the first through-hole 101, a supporting surface capable of supporting the window 101 is created on the third surface 21. In this case, a first adhesive layer 30 is included between the bottom surface of the window and the third surface 21. In addition, a second adhesive layer 40 is included between the second surface 12 and the third surface 21 and between the bottom surface of the window and the third surface 21. Accordingly, a multilayered adhesive structure including the first adhesive layer 30 and the second adhesive layer 40 is included between the bottom surface of the window and the third surface 21, and a leakage prevention effect may be greatly improved through this multilayered adhesive structure. Specifically, a polishing process which is performed using the polishing pad 100 is performed while supplying a fluid such as a liquid slurry onto the polishing surface 11. At this time, components derived from this fluid may flow into the interface between the side surface of the window 102 and the side surface of the first through-hole 101. If these penetrated fluid components flow into the polishing apparatus, disposed under the polishing pad 100, through the second through-hole 201, they may cause a failure of the polishing apparatus or interfere with accurately detecting the endpoint through the window 102. From this point of view, in the polishing pad 100, the second through-hole 201 may be formed to be smaller than the first through-hole 101 to ensure a supporting surface for the window 102 on the third surface 21, and at the same time, a multilayered adhesive structure including the first adhesive layer 30 and the second adhesive layer 40 may be formed on the supporting surface, whereby the leakage prevention effect may be greatly improved.

In addition, the polishing pad 100 includes a partially compressed region CR in the support layer 20 in order to maximize the leakage prevention effect. Specifically, referring to FIG. 2, the compressed region CR is formed in a region of the support layer 20, which corresponds to the bottom surface of the window 102. In this case, the region corresponding to the bottom surface of the window 102 refers to a predetermined area including a portion of the support layer 20, which corresponds to the bottom surface of the window 102, and the extension line of the side surface of the window 102 does not necessarily coincide with the inner end of the compressed region CR. That is, the compressed region CR may be formed in a predetermined region from the side surface of the second through-hole 201 toward the inside of the support layer 20 so as to include any portion corresponding to the bottom surface of the window 102.

The window 102 of the polishing pad of the present disclosure measures absorbance at a certain wavelength of light, and the window 102 may have an absorbance change uniformity (ACU) calculated by the following Equation 1:

$$ACU = \frac{Ax + Ay}{Az} \qquad \text{[Equation 1]}$$

wherein:
Ax is the absorbance of the window, measured with light having a wavelength of x;
Ay is the absorbance of the window, measured with light having a wavelength of y; and
Az is the absorbance of the window, measured with light having a wavelength of Z.

When x is about 550 nm, y is about 750 nm, and z is about 650 nm, the absorbance change uniformity may be about 1.5 to about 2.5.

When x is about 400 nm, y is about 800 nm, and z is about 600 nm, the absorbance change uniformity (ACU) may be about 2 to about 3.5.

When x is about 600 nm, y is about 750 nm, and z is about 675 nm, the absorbance change uniformity (ACU) may be about 1.5 to about 2.5.

The absorbance refers to a quantity indicating the intensity of light absorption, and in general, an absorbance value may somewhat differ depending on the wavelength of light.

As described above, the endpoint detection window 102 is intended to transmit the light emitted from the optical sensor until the polishing-target layer of a semiconductor substrate has a predetermined thickness in a polishing process, that is, in order to detect the polishing endpoint at which polishing is to be stopped.

When the amount of light absorbed by the window 102 differs depending on the wavelength of the light, the performance for endpoint detection differs depending on the type of polishing apparatus including the polishing pad.

The absorbance change uniformity (ACU) indicates the intensity of light absorption by the endpoint detection window 102, and the degree of absorbance change within a certain wavelength range may be considered as an indicator capable of determining the performance for detecting the endpoint of a polishing process by the endpoint detection window 102.

The polishing apparatus that is used in the polishing process irradiates light having a specific wavelength through the endpoint detection window 102 of the polishing pad, and the irradiated light reaches the polishing-target surface of a semiconductor substrate, and the light reflected from the polishing-target surface is then detected by the sensor unit, thereby detecting the endpoint of the polishing process.

However, in the polishing apparatus, when the wavelength of the light from the sensor unit differs between users who perform the polishing process, and the absorbance of light absorbed by the endpoint detection window 102 of the polishing pad greatly changes depending on the wavelength of the light, there will be a large difference in the performance for detecting the endpoint of the polishing process by the endpoint detection window 102.

In order to objectify the performance for detecting the endpoint of the polishing process, in the present disclosure, the concept of absorbance change uniformity (ACU) is introduced in order to objectively evaluate the performance of the endpoint detection window 102 of the polishing pad.

The term "absorbance change uniformity (ACU)" refers to the ratio of the sum of the absorbance values of the window, measured at different wavelengths, to the absorbance value of the window, measured at a reference wavelength.

For the reference wavelength, an absorbance within a wavelength range different from the range specified in the present disclosure may be used, and the reference absorbance is not limited to the reference absorbance used to calculate the ACU of the present disclosure.

The absorbance change uniformity (ACU) is determined by summing the window absorbance values measured at different wavelengths and calculating the ratio of the sum to the window absorbance value measured at the reference wavelength. As the window includes a cured product of a composition containing a prepolymer as described below, a difference in absorbance within the wavelength range of light may occur due to a compound structure included in the cured product.

Due to this characteristic, the window may have a higher absorbance value at a specific wavelength, and may also have a very low absorbance value. Based on this characteristic, the absorbance at the reference wavelength is measured, and then the light absorbance values at wavelengths different from the reference wavelength are measured and the ratio of the sum thereof to the absorbance value at the reference wavelength is calculated.

If the calculated value satisfies the absorbance change uniformity range of the present disclosure, it mean that the change in the absorbance of the endpoint detection window is constant, and if the calculated absorbance change uniformity is excessively small or large, it means that the change in the absorbance is not constant.

The window for detecting the endpoint of the polishing pad satisfies the absorbance change uniformity (ACU) within the above range, and thus the change in the absorbance thereof gradient within a certain wavelength range is constant. Accordingly, even when the wavelength of sensing light that is used in the sensor unit in the polishing apparatus changes, the absorbance of the window may be easily predicted, and thus the window may be universally applied to various types of polishing apparatuses having different sensor units.

That is, the endpoint detection window 102 included within the range specified in the present disclosure may be universally used in polishing apparatuses, but if the absorbance change uniformity (ACU) of the endpoint detection window 102, calculated by measuring the absorbance values thereof at different wavelengths, is not included within the range specified in the present disclosure, the window cannot be universally used in polishing apparatuses.

The endpoint detection window 102 according to another embodiment of the present disclosure have an absorbance difference (AD) calculated by the following Equation 2:

$$AD = \left| \frac{Ax - Ay}{x - y} \right| \quad \text{[Equation 2]}$$

wherein

Ax is the absorbance of the window, measured with light having a wavelength of x, and Ay is the absorbance of the window, measured with light having a wavelength of y.

When x is about 550 nm and y is about 750 nm, the absorbance difference calculated according to Equation 2 may be 0.0004 to 0.0008, preferably 0.0004 to 0.0006, more preferably 0.00042 to 0.00055.

The endpoint detection window of the polishing pad shows an absorbance difference within a certain range, and thus a small change in the absorbance with a change in the wavelength of measurement light. Accordingly, even when the window is applied to polishing apparatuses having different sensing light wavelengths, it may have a lower change in transmittance than a change in the wavelength of measurement light, and thus may have high versatility that satisfies a sensing range regardless of a change in wavelength of measurement light.

As described above, the absorbance of the window does not differ depending on the wavelength of light, and thus the window has a constant performance for endpoint detection results. Accordingly, when the polishing pad of the present disclosure is applied to a polishing process, little error in determining whether the polishing-target layer of the semiconductor substrate has a predetermined thickness occurs, and thus the polishing pad makes it possible to perform the polishing process in high yield.

In one embodiment, the endpoint detection window may include a cured product obtained by curing a window composition containing a urethane-based prepolymer.

In one embodiment, the polishing layer may include a polishing layer including a cured product formed from a composition containing a urethane-based prepolymer, a curing agent and a foaming agent.

The endpoint detection window has the same composition as a polishing layer composition, except for a foaming agent which is included during production of the polishing layer. In view of this fact, each component of each of the window and the polishing layer will now be described.

The term "prepolymer" refers to a polymer with a relatively low molecular weight, the polymerization of which has been stopped in an intermediate step in the production of a cured product so as to facilitate molding. The prepolymer may be formed directly into a final cured product or may be formed into a final cured product after reaction with another polymerizable compound.

In one embodiment, the urethane-based prepolymer may be produced by allowing an isocyanate compound to react with a polyol.

The isocyanate compound that is used in the production of the urethane-based prepolymer may be one selected from the group consisting of an aromatic diisocyanate, an aliphatic diisocyanate, an alicyclic diisocyanate, and combinations thereof.

The isocyanate compound may include, for example, one selected from the group consisting of 2,4-toluene diisocyanate (2,4-TDI), 2,6-toluene diisocyanate (2,6-TDI) naphthalene-1,5-diisocyanate, p-phenylene diisocyanate, tolidine diisocyanate, 4,4'-diphenylmethane diisocyanate, hexamethylene diisocyanate, dicyclohexylmethane diisocyanate, isoporone diisocyanate, and combinations thereof.

The term "polyol" refers to a compound containing at least two hydroxyl groups (—OH) per molecule. The polyol may include, for example, one selected from the group consisting of a polyether polyol, a polyester polyol, a polycarbonate polyol, an acrylic polyol, and combinations thereof.

The polyol may include, for example, one selected from the group consisting of polytetramethylene ether glycol, polypropylene ether glycol, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol, dipropylene glycol, tripropylene glycol, and combinations thereof.

The polyol may have a weight-average molecular weight (Mw) of about 100 g/mol to about 3,000 g/mol. For example, the polyol may have a weight-average average molecule (Mw) of about 100 g/mol to about 3.000 g/mol, for example, about 100 g/mol to about 2,000 g/mol, about 100 g/mol to about 1,800 g/mol.

In one embodiment, the polyol may include a low-molecular-weight polyol having a weight average molecular weight (Mw) of about 100 g/mol to less than about 300 g/mol, and a high-molecular-weight polyol having a weight-average molecular weight (Mw) of about 300 g/mol to about 1800 g/mol.

The urethane-based prepolymer may have a weight-average molecular weight (Mw) of about 500 g/mol to about 3,000 g/mol. The urethane-based prepolymer may have a weight-average molecular weight (Mw) of, for example, about 600 g/mol to about 2,000 g/mol, for example, about 800 g/mol to about 1,000 g/mol.

In one embodiment, the isocyanate compound for producing the urethane-based prepolymer may include an aromatic diisocyanate compound. For example, the aromatic diisocyanate compound may include, for example, 2,4-toluene diisocyanate (2,4-TDI) and 2,6-toluenediisocyanate (2,6-TDI). In addition, the polyol compound for producing the urethane-based prepolymer may include, for example, polytetramethylene ether glycol (PTMEG) and diethylene glycol (DEG).

In another embodiment, the isocyanate compound for producing the urethane-based prepolymer may include an aromatic diisocyanate compound and an alicyclic diisocyanate compound. For example, the aromatic diisocyanate compound may include 2,4-toluene diisocyanate (2,4-TDI) and 2,6-toluene diisocyanate (2,6-TDI), and the alicyclic diisocyanate compound may include dicyclohexylmethanediisocyanate (H12MDI). In addition, the polyol compound for producing the urethane-based prepolymer may include, for example, polytetramethylene ether glycol (PTMEG) and diethylene glycol (DEG).

The urethane-based prepolymer may have an isocyanate end group content (NCO %) of about 5 wt % to about 11 wt %, for example, about 5 wt % to about 10 wt %, for example, about 5 wt % to about 8 wt %, for example, about 8 wt % to about 10 wt %. When the urethane-based prepolymer has NCO % within the above range, the polishing layer of the polishing pad may exhibit appropriate properties and maintain polishing performance required for the polishing process, such as removal rate and polishing profile, and it is possible to minimize defects that may occur on the wafer during the polishing process. In addition, it is possible to control the polishing selectivity between oxide and nitride (oxide removal rate/nitride removal rate), thus preventing dishing, recess and erosion phenomena and achieving wafer surface planarization.

In addition, when the urethane-based prepolymer is applied to an endpoint detection window, the absorbance of the window does not differ depending on the wavelength of light, and thus no difference in the endpoint detection performance thereof appears.

The isocyanate end group content (NCO %) of the urethane-based prepolymer may be designed by comprehensively controlling the types and contents of the isocyanate compound and polyol compound for producing the urethane-based prepolymer, process conditions such as the temperature, pressure and time of the process for producing the urethane-based prepolymer, and the types and contents of additives that are used in the production of the urethane-based prepolymer.

The curing agent is a compound that chemically reacts with the urethane-based prepolymer to form a final cured structure in the polishing layer, and may include, for example, an amine compound or an alcohol compound. Specifically, the curing agent may include one selected from the group consisting of aromatic amines, aliphatic amines, aromatic alcohols, aliphatic alcohols, and combinations thereof.

For example, the curing agent may include one selected from the group consisting of 4,4'-methylenebis(2-chloroaniline (MOCA), diethyltoluenediamine (DETDA), diaminodiphenylmethane, dimethyl thio-toluene diamine (DMTDA), propanediol bis-p-aminobenzoate, methylene bis-methylanthranilate, diaminodiphenylsulfone, m-xylenediamine, isophoronediamine, ethylenediamine, diethylenetriamine, triethylenetetramine, polypropylenediamine, polypropylenetriamine, bis(4-amino-3-chlorophenyl)methane, and combinations thereof.

The content of the curing agent may be about 18 parts by weight to about 27 parts by weight, for example, about 19 parts by weight to about 26 parts by weight, for example, about 20 parts by weight to about 26 parts by weight, based on 100 parts by weight of the urethane-based prepolymer. When the content of the curing agent satisfies the above range, it may more advantageously realize the desired performance of the polishing pad.

The foaming agent is a component for forming a pore structure in the polishing layer, and may include one selected from the group consisting of a solid foaming agent, a gaseous foaming agent, a liquid foaming agent, and combinations thereof.

As described above, in the production of the endpoint detection window, a separate foaming agent is not used because a pore structure is not formed, unlike the production of the polishing layer.

In one embodiment, the foaming agent may include a solid foaming agent, a gaseous foaming agent, or a combination thereof.

The average particle diameter of the solid foaming agent may be about 5 µm to about 200 µm, for example, about 20 µm to about 50 µm, for example, about 21 µm to about 50 µm, for example, about 25 µm to about 45 µm. When the solid foaming agent is thermally expanded particles as described below, the average particle diameter of the solid foaming agent means the average particle diameter of the thermally expanded particles themselves, and when the solid foaming agent is unexpanded particles as described below, the average particle diameter of the solid foaming agent may mean the average particle diameter of the solid foaming agent after being expanded by heat or pressure.

The solid foaming agent may include expandable particles. The expandable particles are particles having a property that can be expanded by heat or pressure, and the size thereof in the final polishing layer may be determined by the heat or pressure applied during the process of producing the polishing layer. The expandable particles may include thermally expanded particles, unexpanded particles, or a combination thereof. The thermally expanded particles are particles pre-expanded by heat, and refer to particles having little or no size change caused by the heat or pressure applied during the process of producing the polishing layer. The unexpanded particles are non-pre-expanded particles, and refer to particles whose final size is determined by expansion caused by the heat or pressure applied during the process of producing the polishing layer.

The expandable particles may include: an outer shell made of a resin material; and an expansion-inducing component enclosed by and present in the outer shell.

For example, the outer shell may include a thermoplastic resin, and the thermoplastic resin may be at least one selected form the group consisting of a vinylidene chloride-based copolymer, an acrylonitrile-based copolymer, a methacrylonitrile-based copolymer, and an acrylic copolymer.

The expansion-inducing component may include one selected from the group consisting of a hydrocarbon compound, a chlorofluoro compound, a tetraalkylsilane compound, and combinations thereof.

Specifically, the hydrocarbon compound may include one selected from the group consisting of ethane, ethylene, propane, propene, n-butane, isobutane, n-butene, isobutene, n-pentane, isopentane, neopentane, n-hexane, heptane, petroleum ether, and combinations thereof.

The chlorofluoro compound may include one selected from the group consisting of trichlorofluoromethane ($CCl_3F$), dichlorodifluoromethane ($CCl_2F_2$), chlorotrifluoromethane ($CClF_3$), tetrafluoroethylene ($CClF_2$—$CClF_2$), and combinations thereof.

The tetraalkylsilane compound may include one selected from the group consisting of tetramethylsilane, trimethylethylsilane, trimethylisopropylsilane, trimethyl-n-propylsilane, and combinations thereof.

The solid foaming agent may optionally include particles treated with an inorganic component. For example, the solid foaming agent may include expandable particles treated with an inorganic component. In one embodiment, the solid foaming agent may include expandable particles treated with silica ($SiO_2$) particles. The treatment of the solid foaming agent with the inorganic component may prevent aggregation between a plurality of particles. The chemical, electrical, and/or physical properties of the surface of the inorganic component-treated solid foaming agent may differ from those of a solid foaming agent not treated with the inorganic component.

The content of the solid foaming agent may be about 0.5 parts by weight to about 10 parts by weight, for example, about 1 part by weight to about 3 parts by weight, for example, about 1.3 parts by weight to about 2.7 parts by weight, for example, about 1.3 parts by weight to about 2.6 parts by weight, based on 100 parts by weight of the urethane-based prepolymer.

The type and content of the solid foaming agent may be designed depending on the desired pore structure and physical properties of the polishing layer.

The gaseous foaming agent may include an inert gas. The gaseous foaming agent may be used as a pore-forming element which is added during a reaction between the urethane-based prepolymer and the curing agent.

The type of inert gas is not particularly limited as long as it does not participate in the reaction between the urethane-based prepolymer and the curing agent. For example, the inert gas may include one selected from the group consisting of nitrogen gas ($N_2$), argon gas (Ar), helium gas (He), and combinations thereof. Specifically, the inert gas may include nitrogen gas ($N_2$) or argon gas (Ar).

The type and content of the gaseous foaming agent may be designed depending on the desired pore structure and physical properties of the polishing layer.

In one embodiment, the foaming agent may include a solid foaming agent. For example, the foaming agent may consist only of a solid foaming agent.

The solid foaming agent may include expandable particles, and the expandable particles may include thermally expanded particles. For example, the solid foaming agent may consist only of thermally expanded particles. When the solid foaming agent consists only of the thermally expanded particles without including the unexpanded particles, the variability of the pore structure may be lowered, but the possibility of predicting the pore structure may increase, and thus the solid foaming agent may advantageously achieve homogeneous pore properties throughout the polishing layer.

In one embodiment, the thermally expanded particles may be particles having an average particle diameter of about 5 μm to about 200 μm. The average particle diameter of the thermally expanded particles may be about 5 μm to about 100 μm, for example, about 10 μm to about 80 μm, for example, about 20 μm to about 70 μm, for example, about 20 μm to about 50 μm, for example, about 30 μm to about 70 μm, for example, about 25 μm to 45 μm, for example, about 40 μm to about 70 μm, for example, about 40 μm to about 60 μm. The average particle diameter is defined as the D50 of the thermally expanded particles.

In one embodiment, the density of the thermally expanded particles may be about 30 kg/m$^3$ to about 80 kg/m$^3$, for example, about 35 kg/m$^3$ to about 80 kg/m$^3$, for example, about 35 kg/m$^3$ to about 75 kg/m$^3$, for example about 38 kg/m$^3$ to about 72 kg/m$^3$, for example, about 40 kg/m$^3$ to about 75 kg/m$^3$, for example, 40 kg/m$^3$ to about 72 kg/m$^3$.

In one embodiment, the foaming agent may include a gaseous foaming agent. For example, the foaming agent may include a solid foaming agent and a gaseous foaming agent. Details regarding the solid foaming agent are as described above.

The gaseous foaming agent may include nitrogen gas.

The gaseous foaming agent may be injected through a predetermined injection line in the process in which the urethane-based prepolymer, the solid foaming agent and the curing agent are mixed together. The injection rate of the gaseous foaming agent may be about 0.8 L/min to about 2.0 L/min, for example, about 0.8 L/min to about 1.8 L/min, for example, about 0.8 L/min to about 1.7 L/min, for example, about 1.0 L/min to about 2.0 L/min, for example, about 1.0 L/min to about 1.8 L/min, for example, about 1.0 L/min to about 1.7 L/min.

The composition for producing the polishing layer and the window may further contain other additives such as a surfactant and a reaction rate controller. The names such as "surfactant" and "reaction rate controller" are arbitrary names given based on the main function of the corresponding substance, and each corresponding substance does not necessarily perform only a function limited to the function indicated by the corresponding name.

The surfactant is not particularly limited as long as it is a material that serves to prevent aggregation or overlapping of pores. For example, the surfactant may include a silicone-based surfactant.

The surfactant may be used in an amount of about 0.2 parts by weight to about 2 parts by weight based on 100 parts by weight of the urethane-based prepolymer. Specifically, the surfactant may be contained in an amount of about 0.2 parts by weight to about 1.9 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, about 0.2 parts by weight to about 1.5 parts by weight, for example, about 0.5 parts by weight to 1.5 parts by weight, based on 100 parts by weight of the urethane-based prepolymer. When the surfactant is contained in an amount within the above range, pores derived from the gaseous foaming agent may be stably formed and maintained in the mold.

The reaction rate controller serves to accelerate or retard the reaction, and depending on the purpose thereof, may include a reaction accelerator, a reaction retarder, or both. The reaction rate controller may include a reaction accelerator. For example, the reaction accelerator may be at least one reaction accelerator selected from the group consisting of a tertiary amine-based compound and an organometallic compound.

Specifically, the reaction rate controller may include at least one selected from the group consisting of triethylenediamine, dimethylethanolamine, tetramethylbutanediamine, 2-methyl-triethylenediamine, dimethylcyclohexylamine, triethylamine, triisopropanolamine, 1,4-diazabicyclo(2,2,2)octane, bis(2-methylaminoethyl)ether, trimethylaminoethylethanolamine, N,N,N,N,N"-pentamethyldiethylenetriamine, dimethylaminoethylamine, dimethylaminopropylamine, benzvldimethylamine, N-ethylmorpholine, N,N-dimethylaminoethvlmorpholine, N,N-dimethylcyclohexylamine, 2-methyl-2-azanorbonene, dibutyltin dilaurate, stannous octoate, dibutyltin diacetate, dioctyltin diacetate, dibutyltin maleate, dibutyltin di-2-ethylhexanoate, and dibutyltin dimercaptide. Specifically, the reaction rate controller may include at least one selected from the group consisting of benzyldimethylamine. N,N-dimethylcyclohexylamine, and triethylamine.

The reaction rate controller may be used in an amount of about 0.05 parts by weight to about 2 parts by weight based on 100 parts by weight of the urethane-based prepolymer. Specifically, the reaction rate controller may be used in an amount of about 0.05 parts by weight to about 1.8 parts by weight, for example, about 0.05 parts by weight to about 1.7 parts by weight, for example, about 0.05 parts by weight to about 1.6 parts by weight, for example, about 0.1 parts by weight to about 1.5 parts by weight, parts, for example, about 0.1 parts by weight to about 0.3 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, about 0.2 parts by weight to about 1.5 parts by weight, for example, about 0.5 parts by weight to about 1 part by weight, based on 100 parts by weight of the urethane-based prepolymer. When the reaction rate controller is used in an amount within the above-described content range, it is possible to appropriately control the curing reaction rate of the preliminary composition to form a polishing layer having pores of a desired size and a desired hardness.

When the polishing pad includes a cushion layer, the cushion layer may serve to absorb and disperse an external impact applied to the polishing layer while supporting the polishing layer, thereby minimizing the occurrence of damage to the polishing target and defects thereon during the polishing process performed using the polishing pad.

The cushion layer may include, but is not limited to, non-woven fabric or suede.

In one embodiment, the cushion layer may be a resin-impregnated nonwoven fabric. The nonwoven fabric may be a fiber nonwoven fabric including one selected from the group consisting of polyester fibers, polyamide fibers, polypropylene fibers, polyethylene fibers, and combinations thereof.

The resin impregnated into the nonwoven fabric may include one selected from the group consisting of polyurethane resin, polybutadiene resin, styrene-butadiene copolymer resin, styrene-butadiene-styrene copolymer resin, acrylonitrile-butadiene copolymer resin, styrene-ethylene-butadiene-styrene copolymer resin, silicone rubber resin, polyester-based elastomer resin, polyamide-based elastomer resin, and combinations thereof.

Hereinafter, a method for producing the polishing pad will be described.

In another embodiment of the present disclosure, there may be provided a method for producing a polishing pad, the method including steps of: preparing a urethane-based prepolymer composition: preparing a composition for producing a window containing the prepolymer composition and a curing agent; producing an endpoint detection window by curing the composition for producing a window: preparing a prepolymer composition; preparing a composition for producing a polishing layer containing the prepolymer composition, a foaming agent and a curing agent; producing a polishing layer by curing the composition for producing a polishing layer, and forming a through-hole in the polishing layer and inserting and bonding the produced window into and to the through-hole.

The step of preparing the prepolymer composition may be a process of producing a urethane-based prepolymer by reacting a diisocyanate compound with a polyol compound. Details regarding the diisocyanate compound and the polyol compound are as described above with respect to the polishing pad.

The isocyanate group content (NCO %) of the prepolymer composition may be about 5 wt % to about 15 wt %, for example, about 5 wt % to about 8 wt %, for example, about 5 wt % to about 7 wt %, for example, about 8 wt % to about 15 wt %, for example, about 8 wt % to about 14 wt %, for example, about 8 wt % to about 12 wt %, for example, about 8 wt % to about 10 wt %.

The isocyanate group content of the prepolymer composition may be derived from the terminal isocyanate groups of the urethane-based prepolymer, the unreacted unreacted isocyanate groups in the diisocyanate compound, and the like.

The viscosity of the prepolymer composition may be about 100 cps to about 1,000 cps, for example, about 200 cps to about 800 cps, for example, about 200 cps to about 600 cps, for example, about 200 cps to about 550 cps, for example, about 300 cps to about 500 cps, at about 80° C.

The foaming agent may include a solid foaming agent or a gaseous foaming agent.

When the foaming agent includes a solid foaming agent, the step of preparing the composition for producing a polishing layer may include steps of: preparing a first preliminary composition by mixing the prepolymer composition and the solid foaming agent; and preparing a second preliminary composition by mixing the first preliminary composition and a curing agent.

The viscosity of the first preliminary composition may be about 1,000 cps to about 2,000 cps, for example, about 1,000 cps to about 1,800 cps, for example, about 1,000 cps to about 1,600 cps, for example, about 1,000 cps to about 1,500 cps, at about 80° C.

When the foaming agent includes a gaseous foaming agent, the step of preparing the composition for producing a polishing layer may include steps of: preparing a third preliminary composition containing the prepolymer composition and the curing agent; and preparing a fourth preliminary composition by injecting the gaseous foaming agent into the third preliminary composition.

In one embodiment, the third preliminary composition may further contain a solid foaming agent.

In one embodiment, the process of producing a window may include steps of: preparing a mold preheated to a first temperature; injecting and curing the composition for producing a window into and in the preheated mold; and post-curing the cured composition for producing a window at a second temperature higher than the preheating temperature.

In one embodiment, the process of producing a polishing layer may include steps of: preparing a mold preheated to a first temperature; injecting and curing the composition for producing a polishing layer into and in the preheated mold; and post-curing the cured composition for producing a polishing layer at a second temperature higher than the preheating temperature.

In one embodiment, the first temperature may be about 60° C. to about 100° C., for example, about 65° C. to about 95° C., for example, about 70° C. to about 90° C.

In one embodiment, the second temperature may be about 100° C. to about 130° C., for example, about 100° C. to 125° C., for example, about 100° C. to about 120° C.

The step of curing each of the composition for producing a window and the composition for producing a polishing layer at the first temperature may be performed for about 5 minutes to about 60 minutes, for example, about 5 minutes to about 40 minutes, for example, about 5 minutes to about 30 minutes, for example, about 5 minutes to about 25 minutes.

The step of post-curing the composition (cured at the first temperature) at the second temperature may be performed for about 5 hours to about 30 hours, for example, about 5 hours to about 25 hours, for example, about 10 hours to about 30 hours, for example, about 10 hours to about 25 hours, for example, about 12 hours to about 24 hours, for example, about 15 hours to about 24 hours.

The method of producing a polishing pad may include a step of processing at least one surface of the polishing layer. The processing step may include forming grooves.

In another embodiment, the step of processing at least one surface of the polishing layer may include at least one of steps of: (1) forming grooves on at least one surface of the polishing layer; (2) line-turning at least one surface of the polishing layer; and (3) roughening at least one surface of the polishing layer.

In step (1), the grooves may include at least one of concentric grooves formed from the center of the polishing layer so as to be spaced apart from each other at a predetermined distance, and radial grooves continuously connected from the center of the polishing layer to the edge of the polishing layer.

In step (2), the line turning may be performed by a method of cutting the polishing layer by a predetermined thickness by means of a cutting tool.

The roughening in step (3) may be performed by a method of processing the surface of the polishing layer with sanding rollers.

The method of producing a polishing pad may further include a step of laminating a support layer on a surface opposite to the polishing surface of the polishing layer.

The support layer has a structure in which a urethane-based resin is impregnated into a nonwoven fabric including polyester resin fiber.

A first through-hole is formed so as to penetrate from a first surface, which is the polishing surface of the polishing layer, to a second surface opposite thereto. Here, the first through-hole is formed in a rectangular parallelepiped shape.

Next, an adhesive film containing a thermoplastic urethane-based adhesive is disposed on one surface (third surface) of the support layer, and then laminated onto the second surface of the polishing layer so as to be in contact with each other, followed by heat sealing using a pressure roller, thereby forming a second adhesive layer.

Then, a second through-hole that penetrates the support layer in the thickness direction is formed by cutting from the bottom surface of the support layer in such a manner that it is formed in a region corresponding to the first through-hole so as to be connected to the first through-hole. Here, the second through-hole is formed in a rectangular parallelepiped shape.

Since the second through-hole is formed to be smaller than the first through-hole, the externally exposed upper portion of the second adhesive layer has a width portion sufficient to come into contact with the horizontal and vertical sides of the window. A moisture-curable adhesive composition is applied to the exposed upper portion of the second adhesive layer, followed by aging for 2 hours. At this time, the moisture-curable adhesive composition is applied using a dispenser having a supply nozzle having a diameter of 100 µm. Then, the window is placed in the first through-hole so as to be supported by the surface having the moisture-curable adhesive composition applied thereto, and is pressed with a load of 100 N for 1 second and then pressed with a load of 900 N for 10 seconds. Thereby, a first adhesive layer is produced in the upper portion of the second adhesive layer that can come into contact with the horizontal and vertical sides of the window. In this case, the first adhesive layer is produced so as not to be disposed between the side surface of the window and the side surface of the first through-hole.

Next, a compressed region CR is formed in a predetermined region in a direction extending from the side surface of the second through-hole toward the inside of the support layer by compressing the bottom surface (fourth surface) of the support layer. The compressed region CR is formed by compression to have a predetermined thickness.

As a result, a polishing pad is produced, which includes a multilayered adhesive structure consisting of the first adhesive layer and the second adhesive layer facing the bottom surface of the window and includes the compressed region in the support layer.

A method for fabricating a semiconductor device according to another embodiment of the present disclosure includes steps of: providing a polishing pad including a polishing layer; performing a polishing process on a polishing target while allowing the polishing target and the polishing pad to rotate relative to each other in a state in which the polishing-target surface of the polishing target is in contact with the polishing surface of the polishing layer; and detecting the thickness of the polishing target and detecting the endpoint of the polishing process, through the endpoint detection window of the polishing pad.

FIG. 2 is a schematic view showing a process for fabricating a semiconductor device according to one embodiment of the present disclosure. A polishing pad 100 may be provided on a surface plate 120 such that the second surface 12 of the polishing layer 10 faces the surface plate 120. In other words, the polishing pad 100 may be disposed on the surface plate 120 such that the top surface of the window 120 and the first surface 11 which is a polishing surface are exposed as the outermost surface.

The polishing target includes a semiconductor substrate 130. The polishing-target surface of the semiconductor substrate 130 may come into direct contact with and the first surface 11 and the top surface of the window 102 or come into indirect contact with and the first surface 11 and the top surface of the window 102 through a flowable slurry or the like. As used herein, the expression "coming into contact with" is construed to include both direct contact and indict contact.

The semiconductor substrate 130 may be supported by a polishing head 160 such that the polishing-target surface thereof faces the polishing pad 100, and in this state, the semiconductor substrate 130 may be polished while rotating in contact with the first surface 11 and the top surface of the window 102 and while being pressed with a predetermined load. For example, the load under which the polishing-target surface of the semiconductor substrate 130 is pressed against the first surface 11 may be selected within the range of, for example, about 0.01 psi to about 20 psi depending on the purpose, and may be, for example, about 0.1 psi to about 15 psi, but is not limited thereto. As the polishing-target surface of the semiconductor substrate 130 is polished with rotation while coming in contact with the first surface 11 and the top surface of the window 102 under a load within the above-described range, it is possible to more advantageously ensure the effect of preventing leakage through the interface between the first surface 11 and the top surface of the window 102 in the process in which the semiconductor substrate repeatedly reciprocates in contact therewith.

The semiconductor substrate 130 and the polishing pad 100 may rotate relative to each other in a state in which the polishing-target surface and the polishing surface are in contact with each other.

In this case, the rotating direction of the semiconductor substrate 130 and the rotating direction of the polishing pad 100 may be the same direction or may be opposite to each other. As used herein, "rotate relative to each other" is understood to include both rotation in the same direction and rotation in opposite directions. The polishing pad 100 is rotated by rotating the surface plate 120 in a state mounted on the surface plate 120, and the semiconductor substrate 130 is rotated by rotating the polishing head 160 in a state mounted on the polishing head 160. The rotating speed of the polishing pad 100 may be selected within the range of about 10 rpm to about 500 rpm depending on the purpose, and may be, for example, about 30 rpm to about 200 rpm, but is not limited thereto. The rotating speed of the semiconductor substrate 130 may be about 10 rpm to about 500 rpm, for example, about 30 rpm to about 200 rpm, for example, about 50 rpm to about 150 rpm, for example, about 50 rpm to about 100 rpm, for example, about 50 rpm to about 90 rpm, but is not limited thereto. When the rotating speed of each of the semiconductor substrate 130 and the polishing pad 100 satisfies the above range, the fluidity of the slurry due to the centrifugal force of the rotation may be properly ensured in relation to the effect of preventing leakage through the interface between the top surface of the window 102 and the first surface 11. That is, as the polishing slurry moves on the first surface 11 and the top surface of the window 102 at an appropriate flow rate, the amount of leakage of the polishing slurry through the interface between the top surface of the window 102 and the first surface 11 may be more advantageous in terms of maximizing the leakage prevention effect of the polishing pad 100 including both the multilayered adhesive structure consisting of the first adhesive layer 30 and the second adhesive layer 40 and the compressed structure of the support layer 20.

In one embodiment, the method for fabricating a semiconductor device may further include a step of supplying a polishing slurry 150 onto the first surface 11. For example, the polishing slurry 150 may be sprayed onto the first surface 11 through a supply nozzle 140. The flow rate of the polishing slurry 150 that is sprayed through the supply nozzle 140 may be about 10 ml/min to about 1,000 ml/min, for example, about 10 ml/min to about 800 ml/min, for example, from about 50 ml/min to about 500 ml/min, but is not limited thereto. When the spray flow rate of the polishing slurry 150 satisfies the above range, the polishing slurry may move on the first surface 11 and the top surface of the window 102 at an appropriate flow rate, and thus the amount of leakage of the polishing slurry through the interface between the top surface of the window 102 and the first surface 11 may be more advantageous in terms of maximizing the leakage prevention effect of the polishing pad 100 including both the multilayered adhesive structure consisting of the first adhesive layer 30 and the second adhesive layer 40 and the compressed structure of the support layer 20.

The polishing slurry 150 may include polishing particles, and the polishing particles may include, for example, silica particles or ceria particles, but are not limited thereto.

The method for fabricating a semiconductor device may further include a step of processing the first surface 11 by a conditioner 170. The step of processing the first surface 11 by the conditioner 170 may be performed at the same time as the step of polishing the semiconductor substrate 130.

The conditioner 170 may process the first surface 11 while rotating. The rotating speed of the conditioner 170 may be, for example, about 50 rpm to about 150 rpm, for example, about 50 rpm to about 120 rpm, for example, about 90 rpm to about 120 rpm.

The conditioner 170 may process the first surface 11 while being pressed against the first surface 11. The pressure load of the conditioner 170 against the first surface 11 may be, for example, about 1 lb to about 10 lb, for example, about 3 lb to about 9 lb.

The conditioner 170 may process the first surface 11 while reciprocating with vibration along a path from the center of the polishing pad 100 to the end of the polishing pad 100. Assuming that the reciprocation of the conditioner 170 from the center of the polishing pad 100 to the end of the polishing pad 100 is one-time vibrational motion, the vibrational motion speed of the conditioner 170 may be about from 10 times/min to about 30 times/min, for example, about 10 times/min to about 25 times/min, for example, about 15 times/min to about 25 times/min.

Since the first surface 11, which is a polishing surface, is polished under a condition under which the semiconductor substrate 130 is pressed against the polishing surface during polishing, the surface roughness becomes lower while the pore structure exposed to the surface is pressed, and thus the polishing surface gradually changes to a state unsuitable for polishing. In order to prevent this phenomenon, a surface state suitable for polishing may be maintained while the first surface 11 is cut by the conditioner 170 having a surface that may be roughened. In this case, when the cut portions of the first surface 11 are not discharged quickly and remain as debris on the polishing surface, they may cause defects such as scratches on the polishing-target surface of the semiconductor substrate 130. From this point of view, as the driving conditions of the conditioner 170, such as rotation speed and pressure conditions, satisfy the above ranges, the surface structure of the first surface 11 may be maintained so that the leakage prevention effect of the polishing pad 100 may be excellently maintained, and at the same time, the surface structure may be advantageous in terms of ensuring the effect of preventing the occurrence of defects on the polishing-target surface of the semiconductor substrate 130.

The method for fabricating a semiconductor device may further include a step of detecting the polishing endpoint of the polishing-target surface of the semiconductor substrate 130 by allowing light emitted from the light source 180 to pass through the window 102 reciprocally. Referring to FIGS. 1 and 2, the second through-hole 201 is connected to the first through hole 101, and thus it is possible to ensure a light pass through which light emitted from the light source 180 passes through the entire thickness from the top surface to the bottom surface of the polishing pad 100, and an optical method of detecting the endpoint through the window 102 may be applied.

At this time, the absorbance of the window 102 differs depending on the wavelength of the light passing through and absorbed by the window, and the difference in the absorbance depending on the wavelength appears to affect the detection of the endpoint of the polishing process, considering that the wavelength of light irradiated differs depending on the type of polishing apparatus.

The endpoint detection window 102 of the present disclosure is characterized in that it shows small changes in absorbance depending on the wavelength of light, and the endpoint detection performance thereof does not change depending on the type of polishing apparatus.

The window 102 may have an absorbance change uniformity (ACU) of 1.5 to 2.5 as calculated by the following Equation 1:

$$ACU = \frac{Ax + Ay}{Az} \quad \text{[Equation 1]}$$

wherein:
Ax is the absorbance of the window, measured with light having a wavelength of x;
Ay is the absorbance of the window, measured with light having a wavelength of y; and
Az is the absorbance of the window, measured with light having a wavelength of z.

When x is about 550 nm, y is about 750 nm, and z is about 650 nm, the absorbance change uniformity may be about 1.5 to about 2.5.

When x is about 400 nm, y is about 800 nm, and z is about 600 nm, the absorbance change uniformity (ACU) may be about 2 to about 3.5.

When x is about 600 nm, y is about 750 nm, and z is about 675 nm, the absorbance change uniformity (ACU) may be about 1.5 to about 2.5.

The step of detecting the endpoint of the polishing process may detect the endpoint of the polishing process through the endpoint detection window by irradiating the polishing-target surface with light having any one wavelength within a wavelength range of 550 nm to 750 nm and detecting the light reflected from the polishing-target surface.

In one embodiment, the endpoint of the polishing process may be detected through the endpoint detection window by irradiating the polishing-target surface with light having any one wavelength within a wavelength range of 400 nm to 800 nm and detecting the light reflected from the polishing-target surface. In this case, when x is 400 nm, y is 800 nm, and z is 600 nm, the endpoint detection window may have an absorbance change uniformity (ACU) of 2 to 3.5.

In one embodiment, the endpoint of the polishing process may be detected through the endpoint detection window 102 by irradiating the polishing-target surface 230 with light having any one wavelength within a wavelength range of 600 nm to 750 nm and detecting the light reflected from the polishing-target surface 230. In this case, when x is 600 nm, y is 750 nm, and z is 675 nm, the endpoint detection window 102 may have an absorbance change uniformity (ACU) of 1.5 to 2.5.

As described above, the endpoint detection window 102 of the present disclosure does not show a difference in absorbance depending on the wavelength of irradiated light, and thus may be provided for a polishing pad that may be used universally in various polishing apparatuses.

The present disclosure includes a polishing layer and an endpoint detection window, and the endpoint detection window makes it possible to provide a polishing pad that may be used universally in various polishing apparatuses, as described above, and does not affect the polishing performance.

Hereinafter, specific examples of the present disclosure will be presented. However, the examples described below serve merely to illustrate or explain the present disclosure in detail, and the scope of the present disclosure should not be limited thereto.

Example 1

Production of Polishing Pad
1-1. Production of Polishing Layer

In a casting system including lines for introducing a mixture of a urethane-based prepolymer, a curing agent and a solid foaming agent, a urethane-based prepolymer having an unreacted NCO content of 9 wt % was introduced into a prepolymer tank, and bis(4-amino-3-chlorophenyl)methane (Ishihara Corp.) was introduced into a curing agent tank. In addition, 100 parts by weight of the urethane-based prepolymer was premixed with 3 parts by weight of the solid foaming agent and then introduced into the prepolymer tank.

The urethane-based prepolymer and MOCA were stirred while they were introduced through the respective input lines into a mixing head at constant rates.

At this time, the molar equivalent of the NCO group of the urethane prepolymer and the molar equivalent of the reactive group of the curing agent were adjusted to 1:1, and the total input rate was maintained at a rate of 10 kg/min.

The stirred raw materials were injected into a mold preheated to 120° C. and prepared into a single porous polyurethane sheet. Thereafter, the surface of the prepared porous polyurethane sheet was ground using a grinding machine, and grooved using a tip, thus producing a sheet having an average thickness of 2 mm and an average diameter of 76.2 cm.

1-2. Production of Window

As a urethane-based prepolymer, PUGL-500D (SKC Co., Ltd.) having an unreacted NCO content of 8.5 wt % was used, and as a curing agent, 4,4'-methylenebis(2-chloroaniline) (MOCA) was used. 100 parts by weight of the urethane-based prepolymer was mixed with 28 parts by weight of the curing agent. A window was produced in the same manner as in Example 1-1, except that inert gas was not introduced during mixing of the raw materials and that the injected raw materials were injected into a post-mold (1,000 mm width, 1,000 mm length, and 50 mm height). The sheet-shaped window was punched, thus producing a window having a width of 20 mm, a length of 60 mm and a thickness of 1.9 mm.

1-3. Support Layer

A support layer having a thickness of 1.4 mm was prepared which had a structure in which a urethane-based resin was impregnated into a nonwoven fabric including polyester resin fibber.

1-4. Production of Polishing Pad

A first through-hole was formed so as to penetrate from the first surface, which is the polishing surface of the polishing layer, to the second surface opposite thereto. The first through-hole was formed in a rectangular parallelepiped shape having a width of 20 mm and a length of 60 mm.

Next, an adhesive film including a thermoplastic urethane-based adhesive was disposed on one surface (third surface) of the support layer, and then laminated onto the second surface of the polishing layer so as to be in contact with each other, followed by heat sealing using a pressure roller at 140° C., thereby forming a second adhesive layer having a thickness of 27±5 μm. Then, a second through-hole that penetrates the support layer in the thickness direction was formed by cutting from the bottom surface of the support layer in such a manner that it was formed in a region corresponding to the first through-hole so as to be connected to the first through-hole. Here, the second through-hole was formed in a rectangular parallelepiped shape having a width of 52 mm and a length of 14 mm.

In the externally exposed upper portion of the second adhesive layer 40, the width portion (W2) corresponding to the horizontal side of the window was 4 mm, and the portion corresponding to the vertical side of the window was 3 mm. A moisture-curable adhesive composition is applied to the exposed upper portion of the second adhesive layer, followed by aging for 2 hours. Then, the window produced in Example 1-2 was placed in the first through-hole so as to be supported by the surface having the moisture-curable adhesive composition applied thereto, and was pressed with a load of 100 N for 1 second and then pressed with a load of 900 N for 10 seconds. Thereby, a first adhesive layer was produced, in which the width portion (W3) corresponding to the horizontal side of the window was 4 mm and the portion corresponding to the vertical side of the window was 3 mm.

Next, a compressed region CR was formed in a predetermined region in a direction extending from the side surface of the second through-hole toward the inside of the support layer by compressing the bottom surface (fourth surface) of the support layer. The compressed region CR was formed by compression to have a thickness of 0.48 μm and a width of 7.5 mm. As a result, a polishing pad having a total thickness of 3.4 mm was produced.

Example 2

Production of Window

As a urethane-based prepolymer, PUGL-500D (SKC Co., Ltd.) having an unreacted NCO content of 8.5 wt % was used, and as a curing agent, 4,4'-methylenebis(2-chloroaniline) (MOCA) was used. 100 parts by weight of the urethane-based prepolymer was mixed with 25 parts by weight of the curing agent. A window was produced in the same manner as in Example 1-1, except that inert gas was not introduced during mixing of the raw materials and that the injected raw materials were injected into a post-mold (1,000 mm width, 1,000 mm length, and 50 mm height). The sheet-shaped window was punched, thus producing a window having a width of 20 mm, a length of 60 mm and a thickness of 1.9 mm.

Production of Polishing Pad

A polishing pad was produced according to the same method as the polishing pad production method described in Example 1-4, except that the window of Example 2 was used.

Example 3

Production of Window

As a urethane-based prepolymer, PUGL-500D (SKC Co., Ltd.) having an unreacted NCO content of 8.5 wt % was used, and as a curing agent, 4,4'-methylenebis(2-chloroaniline) (MOCA) was used. 100 parts by weight of the urethane-based prepolymer was mixed with 23 parts by weight of the curing agent. A window was produced in the same manner as in Example 1-1, except that inert gas was not introduced during mixing of the raw materials and that the injected raw materials were injected into a post-mold (1,000 mm width, 1,000 mm length, and 50 mm height). The sheet-shaped window was punched, thus producing a window having a width of 20 mm, a length of 60 mm and a thickness of 1.9 mm.

Production of Polishing Pad

A polishing pad was produced according to the same method as the polishing pad production method described in Example 1-4, except that the window of Example 3 was used.

Example 4

Production of Window

As a urethane-based prepolymer, PUGL-500D (SKC Co., Ltd.) having an unreacted NCO content of 8.5 wt % was used, and as a curing agent, 4,4'-methylenebis(2-chloroaniline) (MOCA) was used. 100 parts by weight of the urethane-based prepolymer was mixed with 20 parts by weight of the curing agent. A window was produced in the same manner as in Example 1-1, except that inert gas was not introduced during mixing of the raw materials and that the injected raw materials were injected into a post-mold (1,000 mm width, 1,000 mm length, and 50 mm height). The sheet-shaped window was punched, thus producing a window having a width of 20 mm, a length of 60 mm and a thickness of 1.9 mm.

Production of Polishing Pad

A polishing pad was produced according to the same method as the polishing pad production method described in Example 1-4, except that the window of Example 4 was used.

Example 5

Production of Window

As a urethane-based prepolymer. PUGL-500D (SKC Co., Ltd.) having an unreacted NCO content of 8.5 wt % was used, and as a curing agent, 4,4'-methylenebis(2-chloroaniline) (MOCA) was used. 100 parts by weight of the urethane-based prepolymer was mixed with 15 parts by weight of the curing agent. A window was produced in the same manner as in Example 1-1, except that inert gas was not introduced during mixing of the raw materials and that the injected raw materials were injected into a post-mold (1,000 mm width, 1,000 mm length, and 50 mm height). The sheet-shaped window was punched, thus producing a window having a width of 20 mm, a length of 60 mm and a thickness of 1.9 mm.

Production of Polishing Pad

A polishing pad was produced according to the same method as the polishing pad production method described in Example 1-4, except that the window of Example 5 was used.

Comparative Example 1

A polishing pad was produced in the same manner as in Example 2, except that an amine based polyol having an OH value of about 700 mKOH/g was used as a curing agent.

Comparative Example 2

Production of Window

As a urethane-based prepolymer. PUGL-500D (SKC Co., Ltd.) having an unreacted NCO content of 8.5 wt % was used, and as a curing agent, bis(4-amino-3-chlorophenyl) methane was used. 100 parts by weight of the urethane-based prepolymer was mixed with 28 parts by weight of the curing agent. A window was produced in the same manner as in Example 1-1, except that inert gas was not introduced during mixing of the raw materials and that the injected raw materials were injected into a post-mold (1,000 mm width, 1,000 mm length, and 50 mm height). The sheet-shaped window was punched, thus producing a window having a width of 20 mm, a length of 60 mm and a thickness of 1.9 mm.

Production of Polishing Pad

A polishing pad was produced according to the same method as the polishing pad production method described in Example 1-4, except that the window of Comparative Example 2 was used.

Comparative Example 3

Production of Window

As a urethane-based prepolymer, PUGL-500D (SKC Co., Ltd.) having an unreacted NCO content of 8.5 wt % was used, and as a curing agent, a 1:1 mixture of 4,4'-methylenebis(2-chloroaniline) and dimethylthiotoluenediamine was used. 100 parts by weight of the urethane-based prepolymer was mixed with 28 parts by weight of the curing agent. A window was produced in the same manner as in Example 1-1, except that inert gas was not introduced during mixing of the raw materials and that the injected raw materials were injected into a post-mold (1,000 mm width, 1,000 mm length, and 50 mm height). The sheet-shaped window was punched, thus producing a window having a width of 20 mm, a length of 60 mm and a thickness of 1.9 mm.

Production of Polishing Pad

A polishing pad was produced according to the same method as the polishing pad production method described in Example 1-4, except that the window of Comparative Example 3 was used.

Experimental Example 1

Measurement of Absorbance

Each of the windows was cut to a size of 2 cm×6 cm (thickness: 2 mm) and then allowed to stand in an environment having a temperature of 25° C. and a humidity of 50±5% for 16 hours. Thereafter, the absorbance thereof was measured using T60V (PG Instruments Ltd.). The measurement conditions were set as follows. Bandwidth: 1.0 nm, scan speed: 200 nm/min; wavelength at start: 800 nm; and wavelength at end: 400 nm.

The absorbance values at representative wavelengths are shown in Table 1 below.

TABLE 1

| Wavelength (nm) | Example 1 | Example 2 | Example 3 | Example 4 | Example 5 | Comp. Example 1 | Comp. Example 2 | Comp. Example 3 |
|---|---|---|---|---|---|---|---|---|
| 400 | 1.172 | 1.093 | 1.281 | 1.088 | 1.105 | 0.667 | 1.017 | 1.069 |
| 450 | 0.822 | 0.733 | 0.891 | 0.743 | 0.907 | 0.887 | 0.977 | 0.977 |
| 500 | 0.734 | 0.644 | 0.804 | 0.661 | 0.730 | 0.980 | 0.825 | 0.730 |
| 550 | 0.679 | 0.587 | 0.748 | 0.607 | 0.610 | 0.887 | 0.627 | 0.490 |
| 600 | 0.643 | 0.549 | 0.708 | 0.570 | 0.544 | 0.667 | 0.450 | 0.348 |
| 650 | 0.615 | 0.520 | 0.677 | 0.541 | 0.515 | 0.440 | 0.330 | 0.290 |
| 675 | 0.605 | 0.508 | 0.663 | 0.528 | 0.508 | 0.355 | 0.291 | 0.279 |
| 700 | 0.597 | 0.499 | 0.646 | 0.519 | 0.504 | 0.290 | 0.264 | 0.274 |
| 750 | 0.581 | 0.480 | 0.631 | 0.499 | 0.501 | 0.216 | 0.235 | 0.271 |
| 800 | 0.567 | 0.463 | 0.614 | 0.483 | 0.500 | 0.189 | 0.224 | 0.270 |

The absorbance values measured for the windows of Examples 1 to 5 and Comparative Examples 1 to 3 were substituted into Equations 3 to 5 below, and calculations using these Equations were performed. The calculated values are shown in Table 2 below.

$$\frac{550A + 750A}{650A} \quad \text{[Equation 3]}$$

$$\frac{400A + 800A}{600A} \quad \text{[Equation 4]}$$

$$\frac{600A + 750A}{675A} \quad \text{[Equation 5]}$$

wherein:

400A is the absorbance measured at a wavelength of 400 nm;

550A is the absorbance measured at a wavelength of 550 nm;

600A is the absorbance measured at a wavelength of 600 nm;

650A is the absorbance measured at a wavelength of 650 nm;

675A is the absorbance measured at a wavelength of 675 nm; and 750A is the absorbance measured at a wavelength of 750 nm.

In addition, a difference in the absorbance was calculated according to Equation 6 below, and the results of the calculation are shown in Table 2 below:

$$\left| \frac{550A + 750A}{550 - 750} \right| \quad \text{[Equation 6]}$$

wherein 550A is the absorbance measured at a wavelength of 550 nm, and 750A is the absorbance measured at a wavelength of 750 nm.

TABLE 2

|  | Example 1 | Example 2 | Example 3 | Example 4 | Example 5 | Comp. Example 1 | Comp. Example 2 | Comp. Example 3 |
|---|---|---|---|---|---|---|---|---|
| Equation 3 | 2.05 | 2.05 | 2.04 | 2.04 | 2.16 | 2.51 | 2.61 | 2.62 |
| Equation 4 | 2.71 | 2.84 | 2.67 | 2.76 | 2.95 | 1.28 | 2.76 | 3.85 |
| Equation 5 | 2.02 | 2.02 | 2.02 | 2.02 | 2.06 | 2.49 | 2.35 | 2.21 |
| Average absorbance | 0.70 | 0.61 | 0.77 | 0.62 | 0.64 | 0.56 | 0.52 | 0.50 |
| Absorbance difference (Equation 6) | 0.00049 | 0.000535 | 0.000585 | 0.00054 | 0.000545 | 0.003355 | 0.00196 | 0.001095 |

Referring to Table 2 above, from the results of absorbance measurement at various wavelengths, it can be confirmed that, in the case of Examples 1 to 5, the absorbance difference was kept small, and that the absorbance change uniformity (ACU) values calculated according to Equations 3 to 5 were included within the range specified in the present disclosure. Specifically, this means that the endpoint detection windows of Examples 1 to 5 may be used universally in various polishing apparatuses.

In addition, it can be confirmed that Examples 1 to 5 showed an absorbance difference of 4 to 8, which is included in the range specified in the present disclosure. Specifically, Examples 1 to 5 showed an absorbance difference within the specified range, suggesting that the change in absorbance thereof with a change in the wavelength of measurement light is small. Thus, even when the window of each of Examples 1 to 5 is applied to polishing apparatuses having different wavelengths of sensing light, the window may have a low change in transmittance compared to a change in the wavelength of measurement light, and thus may have high versatility that satisfies the sensing range regardless of a change in the wavelength of measurement light.

On the other hand, in the case of Comparative Examples 1 to 3, the absorbance difference value was relatively large, and the values calculated according to Equations 2 and 3 are not included within the range specified in the present disclosure. This means that the windows of Comparative Examples 1 to 3 cannot be used universally in various polishing apparatuses.

Experimental Example 2

Evaluation of Polishing Performance of Polishing Layer
(1) Measurement of Removal Rate Silicon dioxide was deposited on a silicon wafer having a diameter of 300 mm by a chemical vapor deposition (CVD) process. The polishing pad of each of the Examples and the Comparative Examples was attached to a CMP device, and the silicon wafer was mounted so that the silicon dioxide layer of the silicon wafer faced the polishing surface of the polishing pad. While calcined ceria slurry was supplied onto the polishing pad at a rate of 250 mL/min, the silicon dioxide layer was polished under a load of 4.0 psi at a speed of 150 rpm for 60 seconds. After polishing, the silicon wafer was detached from the carrier, mounted on a spin dryer, washed with distilled water, and then dried with nitrogen for 15 seconds. For the dried silicon wafer, the layer thickness change between before and after polishing was measured using an optical interference type thickness-measuring instrument (SI-F80R, Keyence). Then, the removal rate of the silicon wafer was calculated using the following Equation:

Removal rate (Å/min)=polished thickness (Å) of silicon wafer/polishing time (min)   [Equation 7]

For each of the polishing pads of the Examples and the Comparative Examples, the removal rate was measured twice.

(2) Measurement of Cutting Rate of Polishing Pad

The polishing pad of each of the Examples and the Comparative Examples was pre-conditioned with deionized water for 10 minutes, and then conditioned for 1 hour while deionized water was sprayed thereto. The cutting rate of each of the polishing pads was calculated by measuring the thickness that changed during the conditioning process.

The conditioning process was performed using AP-300HM (CTS, Co., Ltd.) under a conditioning pressure of 6 lbf at a rotating speed of 100 to 110 rpm. The disk used for conditioning was LPX-DS2 (Saesol, Co., Ltd.).

TABLE 3

|  | Example 1 | Example 2 | Example 3 | Example 4 | Example 5 | Comp. Example 1 | Comp. Example 2 | Comp. Example 3 |
|---|---|---|---|---|---|---|---|---|
| Average removal rate (Å/min) | 3,724 | 3,357 | 3,253 | 3,105 | 2,345 | 2,809 | 3,325 | 3,458 |
| Pad cutting rate (μm/hr) | 43.3 | 42.2 | 39.3 | 40.2 | 50.4 | 51.3 | 43.2 | 42.5 |

The average removal rate and cutting rate for each polishing pad are shown in Table 3. As a result of measuring the average removal rate and cutting rate for each polishing pad, it was confirmed that the average removal rate and cutting rate were similar without significant differences between the polishing layers of the Examples and the Comparative Examples.

This suggests that, as described above, the endpoint detection window of the present disclosure does not affect the average removal rate and the pad cutting rate, and thus does not have the problem of reducing the polishing performance of the polishing pad, and may also have high versatility that satisfies the sensing range regardless of a change in the wavelength of measurement light, indicating that the window may be used universally in various polishing apparatuses.

As described above, the present disclosure is directed to a endpoint detection window for a polishing pad for use in a polishing process, and to a polishing pad capable of preventing an error in detection of the endpoint of the polishing process by preventing a difference in endpoint detection performance from occurring due to a difference in the wavelength of a laser between polishing apparatus.

In addition, the endpoint detection window of the polishing pad satisfies an absorbance change uniformity (ACU) within the specified range, and thus shows a constant absorbance change within a specific wavelength range. Accordingly, even when the wavelength of sensing light used in a sensor unit in a polishing apparatus changes, the absorbance of the window may be easily predicted, and thus the window may be used universally in various polishing apparatuses having difference sensor units.

In addition, the endpoint detection window of the polishing pad shows an absorbance difference within the specified range, suggesting that the change in absorbance thereof with a change in the wavelength of measurement light is small. Thus, even when the window is applied to polishing apparatuses having different wavelengths of sensing light, the window may have a low change in transmittance compared to a change in the wavelength of measurement light, and thus may have high versatility that satisfies the sensing range regardless of a change in the wavelength of measurement light.

In addition, the present disclosure may provide a method of fabricating a semiconductor device using the polishing pad.

Although preferred embodiments of the present disclosure have been described in detail above, the scope of the present disclosure is not limited thereto, and various modifications and improvements made by those skilled in the art without departing from the basic concept of the present disclosure as defined by the appended claims also fall within the scope of the present disclosure.

What is claimed is:

1. A polishing pad comprising a polishing layer and an endpoint detection window,
    wherein the window comprises a cured product obtained by curing a window composition containing a urethane-based prepolymer and a curing agent, and the urethane-based prepolymer has an unreacted isocyanate group (NCO) content (%) of 8 to 10%,
    wherein an isocyanate compound for producing the urethane-based prepolymer includes an aromatic diisocyanate compound,
    wherein the curing agent is 4,4'-methylenebis(2-chloroaniline) (MOCA),
    wherein the content of the curing agent is 15 parts by weight to about 28 parts by weight, based on 100 parts by weight of the urethane-based prepolymer,
    wherein the window has an absorbance change uniformity (ACU) of 1.5 to 2.5 as calculated by the following Equation 1,
    wherein the window has an absorbance difference (AD) of 0.0004 to 0.0008 calculated by the following Equation 2, $$ACU = \frac{Ax + Ay}{Az} \quad \text{[Equation 1]}$$

wherein:
Ax is an absorbance of the window, measured with light having a wavelength of 550 nm,
Ay is an absorbance of the window, measured with light having a wavelength of 750 nm, and
Az is an absorbance of the window, measured with light having a wavelength of 650 nm,
and $$AD = \left| \frac{Ax - Ay}{x - y} \right|. \quad \text{[Equation 2]}$$

2. The polishing pad of claim 1, wherein the window has a second absorbance change uniformity (ACU2) of 2 to 3.5 calculated by the following Equation 3, $$ACU2 = (Aa + Ab)/Ac \quad \text{[Equation 3]}$$

wherein:
Aa is an absorbance of the window, measured with light having a wavelength of 400 nm,
Ab is an absorbance of the window, measured with light having a wavelength of 800 nm, and
Ac is an absorbance of the window, measured with light having a wavelength of 600 nm.

3. The polishing pad of claim 1, wherein the window has a second absorbance change uniformity (ACU2) of 1.5 to 2.5 calculated by the following Equation 3, $$ACU2 = (Aa + Ab)/Ac \quad \text{[Equation 3]}$$

wherein:
Aa is an absorbance of the window, measured with light having a wavelength of 600 nm,
Ab is an absorbance of the window, measured with light having a wavelength of 750 nm, and
Ac is an absorbance of the window, measured with light having a wavelength of 675 nm.

4. The polishing pad of claim 1, wherein when a plurality of absorbances of the window is measured by irradiating the window with light having a wavelength of 400 nm to 800 nm, an average of the plurality of absorbances is 0.61 to 0.80.

5. A method for producing a polishing pad, the method comprising steps of:
    preparing a urethane-based prepolymer composition;
    preparing a composition for producing a window containing the prepolymer composition and a curing agent;
    producing the window by curing the composition for producing a window;
    preparing a prepolymer composition;
    preparing a composition for producing a polishing layer containing the prepolymer composition, a foaming agent and a curing agent;
    producing a polishing layer by curing the composition for producing a polishing layer, and
    forming a through-hole in the polishing layer and inserting and bonding the produced window into and to the through-hole,
    wherein the urethane-based prepolymer has an unreacted isocyanate group (NCO) content (%) of 8 to 10%,
    wherein the curing agent is 4,4'-methylenebis(2-chloroaniline) (MOCA),
    wherein an isocyanate compound for producing the urethane-based prepolymer includes an aromatic diisocyanate compound,
    wherein the content of the curing agent is 15 parts by weight to about 28 parts by weight, based on 100 parts by weight of the urethane-based prepolymer,
    wherein the window has an absorbance change uniformity (ACU) of 1.5 to 2.5 as calculated by the following Equation 1,
    wherein the window has an absorbance difference (AD) of 0.0004 to 0.0008 calculated by the following Equation 2:

$$ACU = \frac{Ax + Ay}{Az} \quad \text{[Equation 1]}$$

wherein:
Ax is an absorbance of the window, measured with light having a wavelength of 550 nm,
Ay is an absorbance of the window, measured with light having a wavelength of 750 nm, and
Az is an absorbance of the window, measured with light having a wavelength of 650 nm,
and $$AD = \left| \frac{Ax - Ay}{x - y} \right|. \quad \text{[Equation 2]}$$

6. The method of claim 5, wherein the window has a second absorbance change uniformity (ACU2) of 2 to 3.5 calculated by the following Equation 3, $$ACU2 = (Aa + Ab)/Ac \quad \text{[Equation 3]}$$

wherein:
Aa is an absorbance of the window, measured with light having a wavelength of 400 nm,
Ab is an absorbance of the window, measured with light having a wavelength of 800 nm, and
Ac is an absorbance of the window, measured with light having a wavelength of 600 nm.

7. The method of claim 5, wherein the window has a second absorbance change uniformity (ACU2) of 1.5 to 2.5 calculated by the following Equation 3, $$ACU2=(Aa+Ab)/Ac \qquad \text{[Equation 3]}$$

wherein:
Aa is an absorbance of the window, measured with light having a wavelength of 600 nm,
Ab is an absorbance of the window, measured with light having a wavelength of 750 nm, and
Ac is an absorbance of the window, measured with light having a wavelength of 675 nm.

8. The method of claim 5, wherein when a plurality of absorbances of the window is measured by irradiating the window with light having a wavelength of 400 nm to 800 nm, an average of the plurality of absorbances is 0.61 to 0.80.

9. A method for fabricating a semiconductor device, the method comprising steps of:
1) providing a polishing pad comprising a polishing layer and an endpoint detection window;
2) performing a polishing process on a semiconductor substrate while allowing the semiconductor substrate and the polishing layer to rotate relative to each other in a state in which a polishing-target surface of the semiconductor substrate is in contact with a polishing surface of the polishing layer; and
3) detecting a thickness of the semiconductor substrate and detecting an endpoint of the polishing process, through the window of the polishing pad,
wherein the window comprises a cured product obtained by curing a window composition containing a urethane-based prepolymer and a curing agent, and the urethane-based prepolymer has an unreacted isocyanate group (NCO) content (%) of 8 to 10%,
wherein the curing agent is 4,4'-methylenebis(2-chloroaniline) (MOCA),
wherein an isocyanate compound for producing the urethane-based prepolymer includes an aromatic diisocyanate compound,
wherein the content of the curing agent is 15 parts by weight to about 28 parts by weight, based on 100 parts by weight of the urethane-based prepolymer,
wherein the window has an absorbance change uniformity (ACU) of 1.5 to 2.5 as calculated by the following Equation 1,
wherein the window has an absorbance difference (AD) of 0.0004 to 0.0008 calculated by the following Equation 2:

$$ACU = \frac{Ax+Ay}{Az} \qquad \text{[Equation 1]}$$

wherein:
Ax is an absorbance of the window, measured with light having a wavelength of 550 nm,
Ay is the absorbance of the window, measured with light having a wavelength of 750 nm, and
Az is the absorbance of the window, measured with light having a wavelength of 650 nm,
and $$AD = \left| \frac{Ax-Ay}{x-y} \right|. \qquad \text{[Equation 2]}$$

10. The method of claim 9, wherein step 3) comprises detecting the endpoint of the polishing process through the window by irradiating the polishing-target surface with light having any one wavelength within another wavelength range of 550 nm to 750 nm and detecting light reflected from the polishing-target surface.

11. The method of claim 9, wherein step 3) comprises detecting the endpoint of the polishing process through the window by irradiating the polishing-target surface with light having any one wavelength within another wavelength range of 400 nm to 800 nm and detecting light reflected from the polishing-target surface, and
the window has a second absorbance change uniformity (ACU2) of 2 to 3.5 calculated by the following Equation 3, $$ACU2=(Aa+Ab)/Ac \qquad \text{[Equation 3]}$$

wherein:
Aa is an absorbance of the window, measured with light having a wavelength of 400 nm,
Ab is an absorbance of the window, measured with light having a wavelength of 800 nm, and
Ac is an absorbance of the window, measured with light having a wavelength of 600 nm.

12. The method of claim 9, wherein step 3) comprises detecting the endpoint of the polishing process through the window by irradiating the polishing-target surface with light having any one wavelength within another wavelength range of 600 nm to 750 nm and detecting light reflected from the polishing-target surface, and
the window has a second absorbance change uniformity (ACU2) of 1.5 to 2.5 calculated by the following Equation 3, $$ACU2=(Aa+Ab)/Ac \qquad \text{[Equation 3]}$$

wherein:
Aa is an absorbance of the window, measured with light having a wavelength of 600 nm,
Ab is an absorbance of the window, measured with light having a wavelength of 750 nm, and
Ac is an absorbance of the window, measured with light having a wavelength of 675 nm.

13. The method of claim 9, wherein when a plurality of absorbances of the window is measured by irradiating the window with light having a wavelength of 400 nm to 800 nm, an average of the plurality of absorbances is 0.61 to 0.80.

14. The method of claim 9, wherein
the semiconductor substrate comprises a silicon dioxide ($SiO_2$) layer,
the polishing-target surface is a surface of the silicon dioxide ($SiO_2$) layer, and
the silicon dioxide ($SiO_2$) layer has an average removal rate of 2,500 Å/min to 4,000 Å/min.

15. The method of claim 9, wherein the polishing pad has a cutting rate of 35 to 55 μm/hr.

* * * * *